United States Patent [19]

Miura

[11] Patent Number: 4,994,766

[45] Date of Patent: Feb. 19, 1991

[54] FREQUENCY MODULATOR

[75] Inventor: Katsunori Miura, Shijonawate, Japan

[73] Assignee: Sanyo Electric Co., Ltd., Osaka, Japan

[21] Appl. No.: 554,497

[22] Filed: Jul. 19, 1990

[30] Foreign Application Priority Data

Jul. 20, 1989 [JP] Japan .................................. 1-187809

[51] Int. Cl.$^5$ .................................................. A03C 3/00
[52] U.S. Cl. ...................................... 332/117; 332/126
[58] Field of Search ................ 332/117, 123, 125, 126

[56] References Cited

U.S. PATENT DOCUMENTS

| | | | |
|---|---|---|---|
| 3,500,248 | 3/1970 | Stratman | 332/117 |
| 4,610,030 | 9/1986 | Dominguez et al. | 332/117 X |
| 4,706,047 | 11/1987 | Avila et al. | 332/117 |

Primary Examiner—Robert J. Pascal
Attorney, Agent, or Firm—Armstrong, Nikaido, Marmelstein, Kubovcik & Murray

[57] ABSTRACT

A frequency modulator is formed in a monolithic integrated circuit as a whole. A direct current signal from a center frequency control circuit and an alternating current signal from a voltage controlled amplifier (VCA) which receives a modulation signal and outputs the alternating current signal are applied to a control input of a voltage controlled oscillator (VCO). A center frequency (Fo) of the VCO is determined by the direct current signal from the center frequency control circuit and a frequency deviation amount (Δf) of the VCO is determined by the alternating current signal from the VCA, and therefore, a frequency-modulated signal of Fo+Δf can be outputtd from the VCO. The direct current signal from the center frequency control circuit is also applied to a control input of the VCA, and therefore, the center frequency of the VCO as well as an amplitude of the alternating current signal, that is, the frequency deviation amount can be controlled by only the direct current signal.

6 Claims, 8 Drawing Sheets

FREQUENCY MODULATOR

BACKGROUND OF THE INVENTION

1. Field of the invention

The present invention relates to a frequency modulator. More specifically, the present invention relates to a frequency modulator which is utilized in a video or sound signal recording circuit, and etc. of a VTR, for example, and is constituted by a monolithic integrated circuit (IC).

2. Description of the prior art

One example of a well-known frequency modulator is shown in FIG. 2. As shown in FIG. 2, a frequency modulator is generally constituted such that a modulation signal is added to a control voltage for a voltage controlled oscillator (VCO). In addition, a frequency-modulated signal (FM signal) can be represented by a center frequency Fo and a frequency deviation amount $\Delta f$ in a case where the modulation signal like a sound signal includes no direct current components.

Then, assuming that an oscillation frequency of the VCO is F, the following equation (1) is obtainable.

$$F = K_t \cdot V \qquad (1)$$

where, V is a control voltage and Kt is a conversion coefficient.

If the above described equation (1) is divided into the center frequency Fo and the frequency deviation amount $\Delta f$, since the center frequency Fo and the frequency deviation amount $\Delta f$ are corresponding to a direct current control voltage Vo and a modulation signal $\Delta v$, respectively, the equation (1) can be modified as follows:

$$F = Fo + f = K_t(Vo + \Delta v) \qquad (2)$$

Normally, due to variations of characteristics of an oscillation capacitor and a coil within the VCO and temperature drift thereof, the equation (2) can be modified as follows:

$$F = Fo + \Delta f = K_t(Vo' + \Delta v') = K_t(\alpha Vo + \beta \Delta v) \qquad (3)$$

In the equation (3), $Vo' = \alpha Vo$ and $\Delta v' = \beta \Delta v$, and therefore, in the frequency modulator as shown in FIG. 2, it is necessary to respectively adjust the direct current control voltage Vo and the modulation signal $\Delta v$ so as to correct the conversion coefficient Kt by correction values $\alpha$ and $\beta$ so that the center frequency Fo and the frequency deviation amount $\Delta f$ become target values, respectively.

In the frequency modulator of the above described prior art, it is necessary adjust or control the center frequency Fo and the frequency deviation amount $\Delta f$. By an application of an APC (Automatic Phase Control) by a PLL (Phase Locked Loop), the center frequency Fo can be maintained in a crystal accuracy without any adjustment; however, an adjustment of the frequency deviation amount $\Delta f$ is still indispensable to such a frequency modulator, and therefore, there were necessity of a component for adjusting the frequency deviation amount (normally such a component is variable resistor) and an adjustment step thereof.

SUMMARY OF THE INVENTION

Therefore, a principal object of the present invention is to provide a novel frequency modulator.

The other object of the present invention is to provide a frequency modulator without necessity of an adjustment of a frequency deviation amount ($\Delta f$).

A frequency modulator in accordance with the present invention comprises: a VCO having a first control input which receives a control signal; center frequency control means for generating a direct current signal which determines a center frequency of the VCO; a voltage controlled amplifier (VCA) for generating an alternating current signal which has an amplitude responsive to a modulation signal and determines a frequency deviation amount of the VCO, said VCA having a second control input; first voltage applying means for applying the direct current signal and the alternating current signal to the first control input of the VCO; and second voltage applying means for applying the direct current to the second control input of the VCA, said direct current signal controlling the amplitude of said alternating current signal.

In accordance with the present invention, since both the center frequency Fo and the frequency deviation amount $\Delta f$ of the VCO can be controlled by only the direct current signal from the center frequency control means, it becomes possible to omit an adjustment for compensating variations of the characteristics of the VCO, temperature drift and the like to set the frequency deviation amount in an optimum condition.

The objects and other objects, features, aspects and advantages of the present invention will become more apparent from the following detailed description of the embodiments of the present invention when taken in conjunction with accompanying drawings.

DETAIL DESCRIPTION OF THE PREFERRED EMBODIMENT

Figure 1:
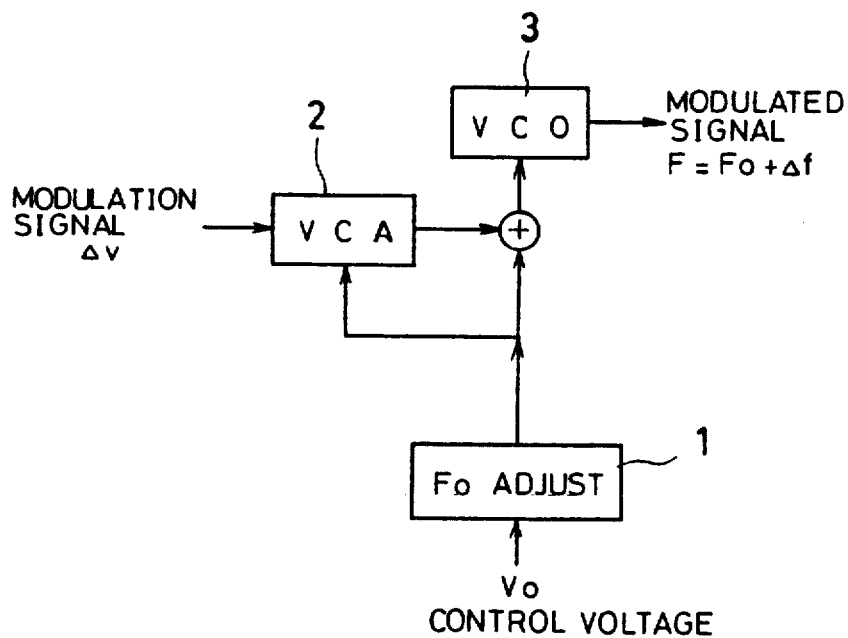
FIG. 1 is a block diagram showing one embodiment in accordance with the present invention.

FIG. 1 is a basic block diagram showing one embodiment in accordance with the present invention, wherein an adjustment of a center frequency Fo is performed by a center frequency control circuit (Fo control circuit) 1 and an adjustment of a frequency deviation amount $\Delta f$ is performed by a voltage controlled amplifier (VCA) 2 which is controlled by an output of Fo control circuit 1.

In a case where the output VO' of the Fo control circuit 1 is equal to $\alpha$Vo where the direct current control voltage Vo is corrected by a correction value $\alpha$ as done in the prior art, assuming that the conversion rate of the VCA 2 is m, a correction value $\beta$ for the VCA 2 is represented by the following equation (4).

$$\beta = m\alpha Vo \tag{4}$$

On the other hand, dividing the equation (3), the following equations (5) and (6) can be obtained.

$$Fo = Kt \cdot \alpha Vo \tag{5}$$

$$\Delta f = Kt \cdot \beta \Delta v \tag{6}$$

Since the center frequency Fo is set to be coincident with a constant target value and the conversion coefficient Kt is also a constant value, the following equation (7) is obtainable in accordance with the equation (5).

$$\alpha Vo = Fo/Kt \tag{7}$$

Therefore, $\alpha$Vo also becomes constant If the equations (7) and (4) are substituted for the equation (6), the following equation (8) is obtainable.

$$\Delta f = Kt \cdot \beta \cdot \Delta v = Kt \cdot m\alpha Vo \cdot \Delta v = Kt \cdot m \cdot (Fo/Kt)\Delta v = m \cdot Fo \cdot \Delta v \tag{8}$$

As clearly understood from the equation (8) the frequency deviation amount $\Delta f$ is not dependent on the conversion coefficient Kt and the same is determined by the conversion rate m of the VCA 2 and the center frequency Fo. Therefore, if the conversion rate m is set to be coincident with a target value, regardless of variations of characteristics of components such as a capacitor or the like of the VCO 3 which receives an added output of the output of the Fo control circuit 1 and the output of the VCA 2, and a temperature drift thereof, the frequency deviation amount $\Delta f$ is primarily determined with respect to a given center frequency Fo, and therefore, it becomes unnecessary to adjust the frequency deviation amount $\Delta f$.

Figure 3:
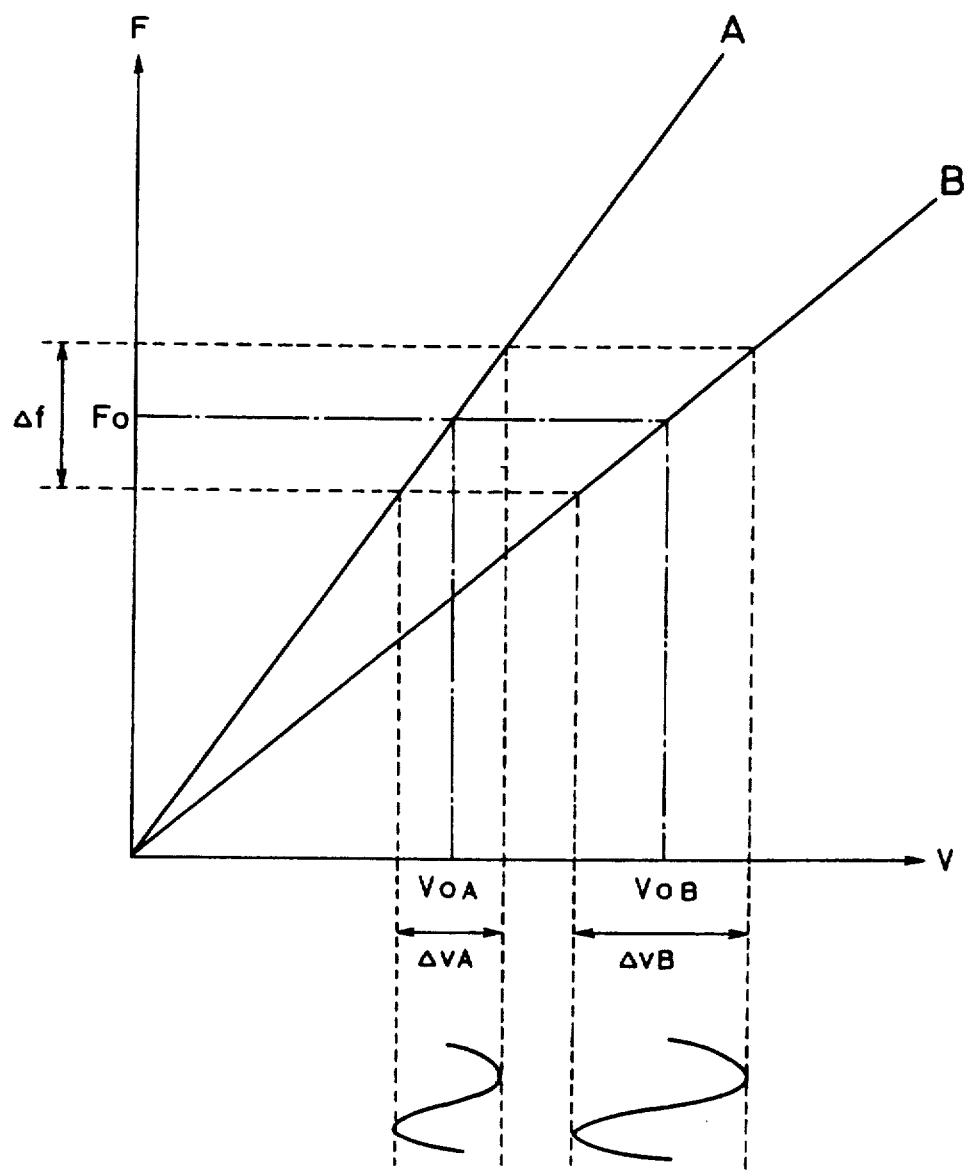
FIG. 3 is a graph showing a relationship between a voltage and a frequency of a VCO, wherein parameters are variations of characteristics thereof.

FIG. 3 is a graph showing a principle why the adjustment of the aforementioned $\Delta f$ becomes unnecessary. In FIG. 3, a voltage V and a frequency F are respectively indicated on an abscissa and an ordinate, and slants of linear lines A and B respectively indicate the conversion coefficients Kt, which show a difference due to a temperature drift. In any characteristics of the linear lines A and B, a center frequencies Fo and frequency deviation amounts $\Delta f$ as targeted are the same with each other, respectively, and therefore, in a case of the linear line A, the direct current control voltage and the modulation signal become $V_{OA}$ and $\Delta v_A$, respectively, and in a case of the linear line B, the direct current control signal and the modulation signal become $V_{OB}$ and $\Delta v_B$, respectively.

As clearly understood from FIG. 3, the direct current control voltage has a predetermined relationship with the modulation signal, and therefore, even if there are variations of the characteristics of the conversion coefficient Kt due to a temperature drift, when the modulation signal is controlled by the direct current control voltage, a predetermined frequency deviation amount $\Delta f$ can be maintained.

Figure 4:
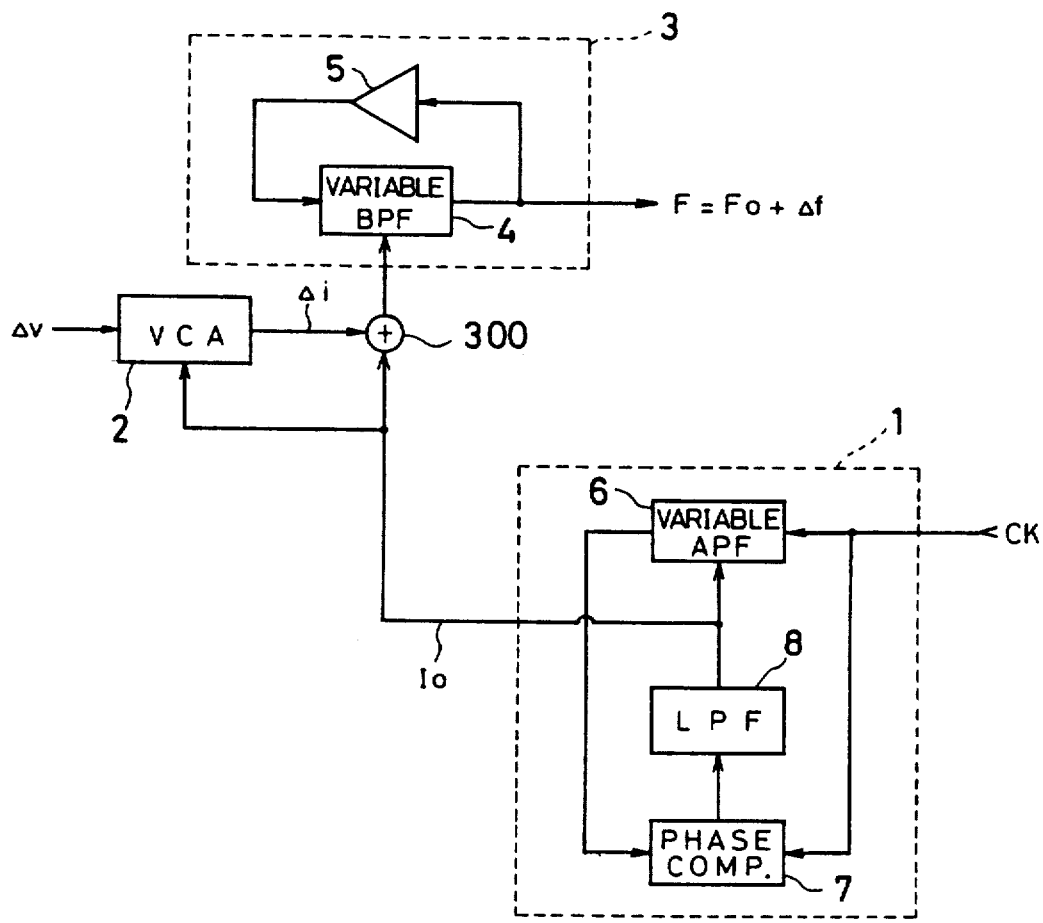
FIG. 4 is a block diagram showing a major portion of FIG. 1 embodiment.

FIG. 4 is a block diagram showing FIG. 1 block diagram in detail. In FIG. 4, the VCO 3 is constituted by current controlled variable band-pass filter (hereinafter, simply called as "variable BPF") 4 and a closed loop having the same phase and a fixed gain more than 1 through an amplifier 5.

In addition, the Fo control circuit 1 includes a variable all-pass filter (hereinafter, simply called as "variable APF") 6 which receives a clock signal CK having a fixed frequency, a phase comparator 7 which performs a phase comparison of an input and an output of the variable APF 6, and a low-pass filter (LPF) 8 which receives an output of the phase comparator 7 and controls the variable APF 6 by an output thereof. As described above, if the variable APF 6 is controlled by the output of the LPF 8, that is, an error signal which is the output of the phase comparator 7, a resonant point of the variable APF 6 can be in proportion to a frequency of the clock signal CK. In addition, the phase comparator 7 outputs the error signal of zero when a phase difference between the input and the output of the variable APF 6 is zero. The clock signal CK may be generated by a crystal oscillator (not shown).

Figure 4A:
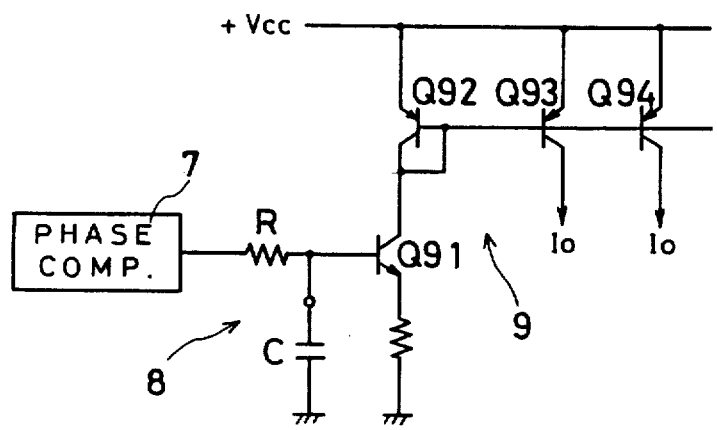
FIG. 4A is a circuit diagram showing an output portion of a low-pass filter.

With reference to FIG. 4A, the LPF 8 which receives the output of the phase comparator 7 includes a resistor R and a capacitor C, and an output of the LPF 8 is applied to a base of a transistor Q91 constituting a converting circuit 9. The converting circuit 9 is a circuit for converting the output voltage of the LPF 8 into a current which is in proportion thereto. An emitter resistor is connected to an emitter of the transistor Q91 and a collector thereof is connected to the voltage source +Vcc through a transistor Q92. The transistor Q92 forms a current mirror circuit along with transistors Q93 and Q94. Therefore, the output voltage of the LPF 8 is converted into a control current Io by the converting circuit 9.

More specifically, when the transistor Q91 is turned-on by the output voltage of the LPF 8, an emitter current determined by the emitter resistor flows in the transistor Q91 and the emitter current is in proportion to the output voltage of the LPF 8. Then, in a transistor circuit, generally, a emitter current and a collector current is substantially equal to each other, and therefore, a current being in proportion to the output voltage of the LPF 8 flows in the collector of the transistor Q91, that is, the transistor Q92. Since the transistors Q93 and Q94 constitute the current mirror circuit along with the transistor Q92, the same current as that of the transistor Q92 flows in each of the transistors Q93 and Q94. Each of output currents of the transistors Q93 and Q94 becomes the control current Io, which is applied to the variable BPF 4 and the variable APF 6 respectively constituting the VCO 3 and VCA 2 as shown in FIG. 4.

The variable APF 6 and the variable BPF 4 shown in FIG. 4 are formed in a single monolithic IC with the same circuit configuration, and more specifically, the same are constituted by utilizing a secondary variable filter which will be described later.

Then, with reference to FIG. 6, a secondary variable filter 20 which can operate as the variable BPF and the variable APF utilized in this embodiment shown will be described.

Figure 6:
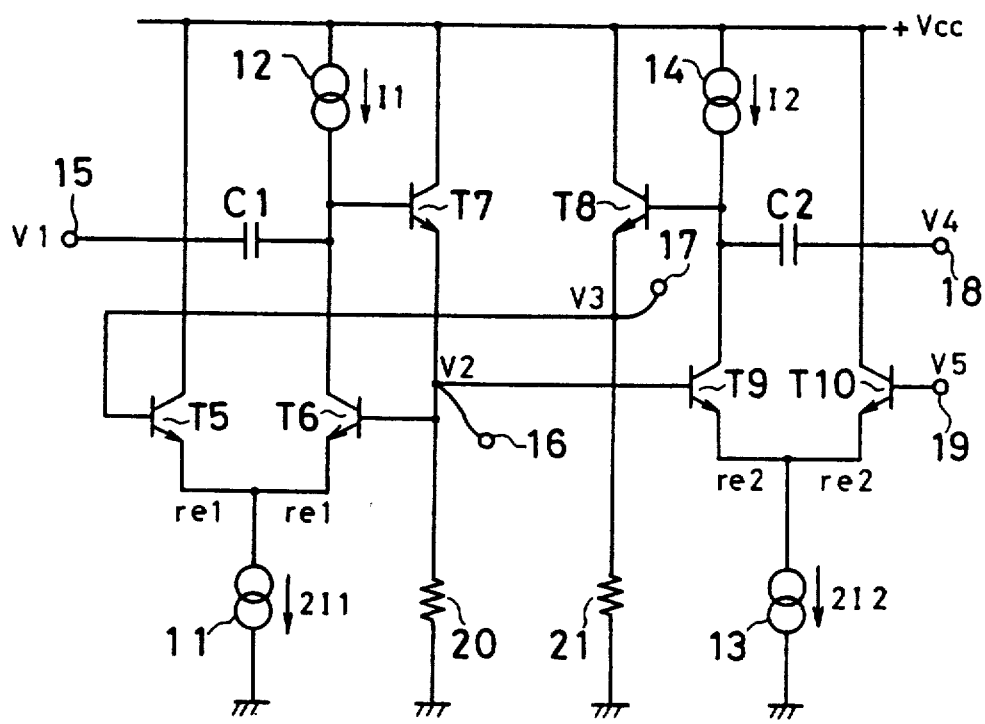
FIG. 6 is a circuit diagram showing one example of a variable filter capable of being utilized as a variable band-pass filter and a variable all-pass filter as shown in FIG. 4.

FIG. 6 is a circuit diagram showing a principle of the variable filter In FIG. 6, transistors T5 and T6 constitute a deferential pair, and emitters thereof are commonly connected to a constant current source circuit 11. The transistor T5 is supplied with the voltage +Vcc at a collector thereof, and a collector of the transistor T6 is connected to a constant current source circuit 12 and a base of a transistor T7 and to a terminal 15 through a capacitor C1. In addition, a current amount of the constant current source circuit 11 is set twice (2I1) a current amount I1 of the constant current source circuit 12.

Transistors T9 and T10 also constitute a deferential pair, and emitters thereof are commonly connected to a constant current source circuit 13. The transistor T10 is supplied with the voltage +Vcc at a collector thereof, and a collector of the transistor T9 is connected to a constant current source circuit 14 and a base of a transistor T8 and to a terminal 18 through a capacitor C2. In addition, a base of the transistor T10 is connected to a terminal 19. Furthermore, a current amount of the constant current source circuit 13 is set twice (2I2) a current amount I2 of the constant current circuit 14.

The transistor T7 is paired with the transistor T8 and the voltage +Vcc is applied to respective collectors thereof. In addition, an emitter of the transistor T7 is connected to bases of the transistors T6 and T9 and a terminal 16, and an emitter of the transistor T8 is connected to a base of the transistor T5 and a terminal 17.

In addition, V1, V2, V3, V4 and V5 respectively correspond to voltage values of signals at the terminals 15, 16, 17, 18 and 19.

As to the differential pairs respectively constituted by the transistors T5 and T6 and the transistors T9 and T10 of the variable filter 20, each having the above described configuration, the following equations (9) and (10) are established, respectively.

$$(V3 - V2)/2re1 = (V2 - V1)/\frac{1}{j\omega C1} \tag{9}$$

$$(V5 - V2)/2re2 = (V3 - V4)/\frac{1}{j\omega C2} \tag{10}$$

The principle why the equations (9) and (10) can be obtained will be described with reference to FIG. 8A—FIG. 8E.

Figure 8A:
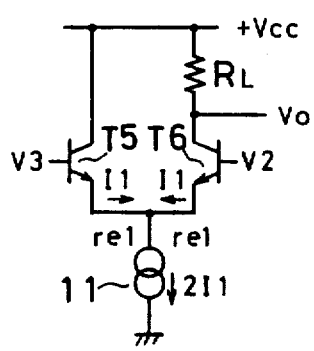
FIG. 8A–FIG. 8E are partial circuit diagrams showing an operational principle of FIG. 7 circuit.

First, noting a differential pair composed of transistors T5 and T6 as shown in FIG. 8A, in which a load resistor RL is inserted in place of the constant current source circuit 12, in accordance with characteristics of the differential pair, a collector voltage V0 of the transistor T6 is represented by the following equation (1);

$$V0 = gm \cdot RL \cdot (V3 - V2) \tag{11}$$

where gm is a mutual conductance.

Assuming that a charge of an electron is ($1.602 \times 10^{-19}$C), Boltzmann's constant is K ($1.38 \times 10^{-23}$J/K), and an absolute temperature is T, a relationship represented by the following equation (12) is established.

$$gm = \frac{q \cdot (2I1)}{4KT} = \frac{qI1}{2KT} \tag{12}$$

In addition, by using the differential resistor re1=Kt/qI1=½gm, the above equation (11) can be modified as follows:

$$V0 = \frac{1}{2re1} \cdot RL \cdot (V3 - V2) \tag{13}$$

Figure 8C:
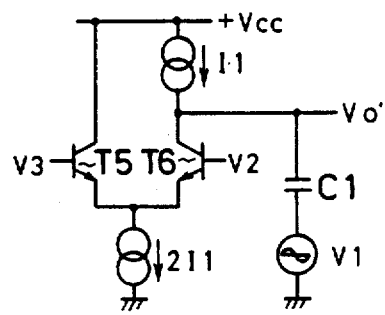
Figure 8D:
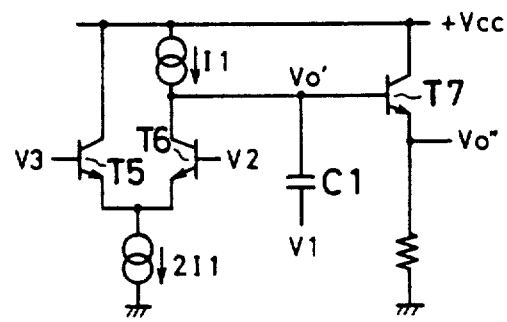
Figure 8B:
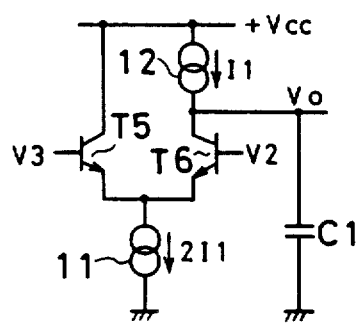

Next, as shown in FIG. 8B, if the load resistor RL is replaced with a constant current source circuit 12 having a current amount of I1 and a capacitor C1 is connected between a collector of the transistor T6 and the ground, since an impedance of the constant current source circuit 12 can be regarded as infinity and an impedance $1/j\omega C1$ is corresponding to the load resister RL, when the equation (13) is applied to FIG. 8B the following equation (14) can be obtained.

$$V0 = \frac{1}{2re1} \cdot \frac{1}{j\omega C1} \cdot (V3 - V2) \tag{14}$$

Now, as shown in FIG. 8C, if an alternating current voltage source having an output voltage of V1 is further connected between the capacitor C1 and the ground, assuming that a collector voltage of the transistor T6 is V0', the following equation (15) is obtainable in accordance with the equation (14).

$$V0' = \frac{1}{2re1} \cdot \frac{1}{j\omega C1} \cdot (V3 - V2) + V1 \tag{15}$$

Next, as shown in FIG. 8D, when an emitter follower is constituted by a transistor T7, assuming that an emitter voltage of the transistor T7 is V0'', since the equation V0'=V0'' can be established in the emitter follower, the following equation (16) can be obtained in accordance with the equation (15).

$$V0'' = \frac{1}{2re1} \cdot \frac{1}{j\omega C1} \cdot (V3 - V2) + V1 \tag{16}$$

Figure 8E:
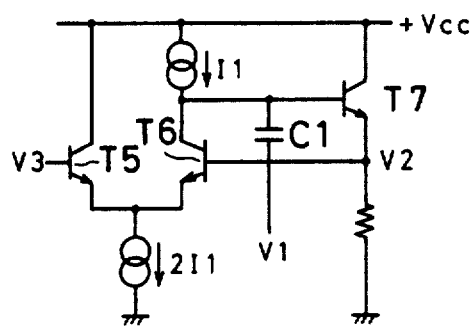

If a portion corresponding to FIG. 8D circuit is derived from FIG. 6, the portion can be illustrated as shown in FIG. 8E, and when the both are compared with each other, the equation V0''=V2 can be established and therefore, the following equation (17) can be obtained in accordance with the equation (16).

$$V2 = \frac{1}{2re1} \cdot \frac{1}{j\omega C1} \cdot (V3 - V2) + V1 \tag{17}$$

If the equation (17) is modified, the above described equation (9) is obtained.

As similar to the above, in connection to the differential pair constituted by the transistors T9 and T10, the above described equation (10) is obtainable in accordance with the same evaluating method. However, the differential resistor of the differential pair by the transistors T9 and T10 is re2.

In the equations (9) and (10), when V3 is eliminated by $j\omega = S$, the following equation (18) is obtainable.

$$S^2 \cdot 4re1re2 \cdot C1C2 \cdot V1 + S \cdot 2re2C2 \cdot V4 + V5 = (S^2 \cdot 4re1 \cdot re2 \cdot C1C2 + S \cdot 2re2C2 + 1)V2 \tag{18}$$

In the equation (18), by applying respective conditions as described later to respective values of V1, V2, V3, V4 and V5, it is possible to vary a characteristic of the variable filter as shown in FIG. 6.

(Condition 1)

$V1 = V5 = 0$, $V4 = Vin$ and $V2 = Vout$

In this case, the above described equation (18) is modified as follows:

$$S \cdot 2re2C2 \cdot Vin = (S^2 \cdot 4re1re2 \cdot C1C2 + S \cdot 2re2C2 + 1) \cdot Vout \quad Vout/Vin = S \cdot 2re2C2/(S^2 4re1re2 \cdot C1C2 + S \cdot 2re2 \, C2 + 1)$$

Since the following equation (24) is obtained, the following equation (19) is obtainable.

$$\omega o = (1/4re1re2 \cdot C1C2)^{\frac{1}{2}} = \frac{q}{2KT}(I1I2/C1C2)^{\frac{1}{2}} \quad (24)$$

Assuming that the Q is given as follows:

$$Vout/Vin = S \cdot \frac{\omega o}{Q} \Big/ \left( S^2 + \frac{\omega o}{Q} \cdot S + \omega o^2 \right) \quad (19)$$

The equation (19) indicates a transfer function of a band-pass filter.

Therefore, when the above described condition 1 is satisfied, that is, when the terminals 15 and 19 are connected to the ground in an alternating current and the terminals 18 and 16 are used as an input terminal and an output terminal of the variable filter 20, the variable filter 20 operates as a variable BPF.

In the equation (19), $\omega o$ is an oscillation angle frequency of the BPF, which is variable by changing the current amounts 2I1 and 2I2 of the constant current source circuits 11 and 13. In addition, Q indicates a sharpness of the filter, which is also variable by changing the current amounts 2I1 and I12. In other words, by controlling the current amounts 11 and 12, it is possible to vary a characteristic of the variable BPF.

(Condition 2)

$V1 = V5 = Vin$, $V4 = -Vin$, and $V2 = Vout$

In this case, in accordance with the above described equation (18), the following equation (20) is obtainable.

$$Vout/Vin = \left( S^2 - \frac{\omega o}{Q} \cdot S + \omega o^2 \right) \Big/ \left( S^2 + \frac{\omega o}{Q} \cdot S + \omega o^2 \right) \quad (20)$$

The equation (20) indicates a transfer function of an all-pass filter.

Therefore, when the above described condition 2 is satisfied, that is, when the terminals 15 and 19 are commonly used as an input terminal and a signal having a reverse polarity to an input signal is inputted to the terminal 18 and the terminal 16 is used as an output terminal, the variable filter 20 shown in FIG. 6 operates as a variable APF, and a characteristic thereof is depend on the current amounts I1 and I2.

(Condition 3)

$V1 = V5 = Vin$, $V4 = 0$ and $V2 = Vout$

In this case, in accordance with the above described equation (18), the following equation (21) is obtainable.

$$Vout/Vin = (S^2 + \omega o^2) \Big/ \left( S^2 + \frac{\omega o}{Q} \cdot S + \omega o^2 \right) \quad (21)$$

The equation (21) indicates a transfer function of a band-elimination filter (BEF).

Therefore, when the above described condition 3 is satisfied, that is, when the terminals 15 and 19 are commonly used as an input terminal and the terminal 18 is connected to the ground in alternating current and the terminal 16 is used as an output terminal, the variable filter shown in FIG. 6 operates as a variable BEF, and a characteristic thereof is dependent on the current amounts I1 and I2.

(Condition 4)

$V1 = Vin$, $V4 = V5 = 0$ and $V2 = Vout$

In this case, in accordance with the above described equation (18), the following equation (22) is obtainable.

$$Vout/Vin = \frac{\omega o}{Q} \cdot S^2 \Big/ \left( S^2 + \frac{\omega o}{Q} \cdot S + \omega o^2 \right) \quad (22)$$

The equation (22) indicates a transfer function of a secondary high-pass filter (HPF).

Therefore, when the above described condition 4 is satisfied, that is, when the terminal 15 is used as an input terminal and the terminals 18 and 19 are connected to the ground in alternating current and the terminal 16 is used as an output terminal, the variable filter 20 operates as a variable HPF, and a characteristic thereof is dependent on the current amounts I1 and I2.

(Condition 5)

$V1 = V4 = 0$, $V5 = Vin$ and $V2 = Vout$

In this case, in accordance with the above described equation (18), the following equation (23) is obtainable.

$$Vout/Vin = \omega o^2 \Big/ \left( S^2 + \frac{\omega o}{Q} \cdot S + \omega o^2 \right) \quad (23)$$

The equation (23) indicates a transfer function of a secondary low-pass filter (LPF).

Therefore, when the above described condition 5 is satisfied, that is, when the terminal 19 is used as an input terminal and the terminals 15 and 18 are connected to the ground in alternating current and the terminal 16 is used as an output terminal, the variable filter 20 operates as an LPF, and a characteristic thereof is dependent on the current amounts I1 and I2.

As described above, by applying the respective conditions without changing the circuit configuration, it is possible to operate the variable filter 20 as shown in FIG. 6 as a variable BPF or variable APF, and it is possible to control the characteristic of the filter by the current amounts I1 and I2.

Figure 7:
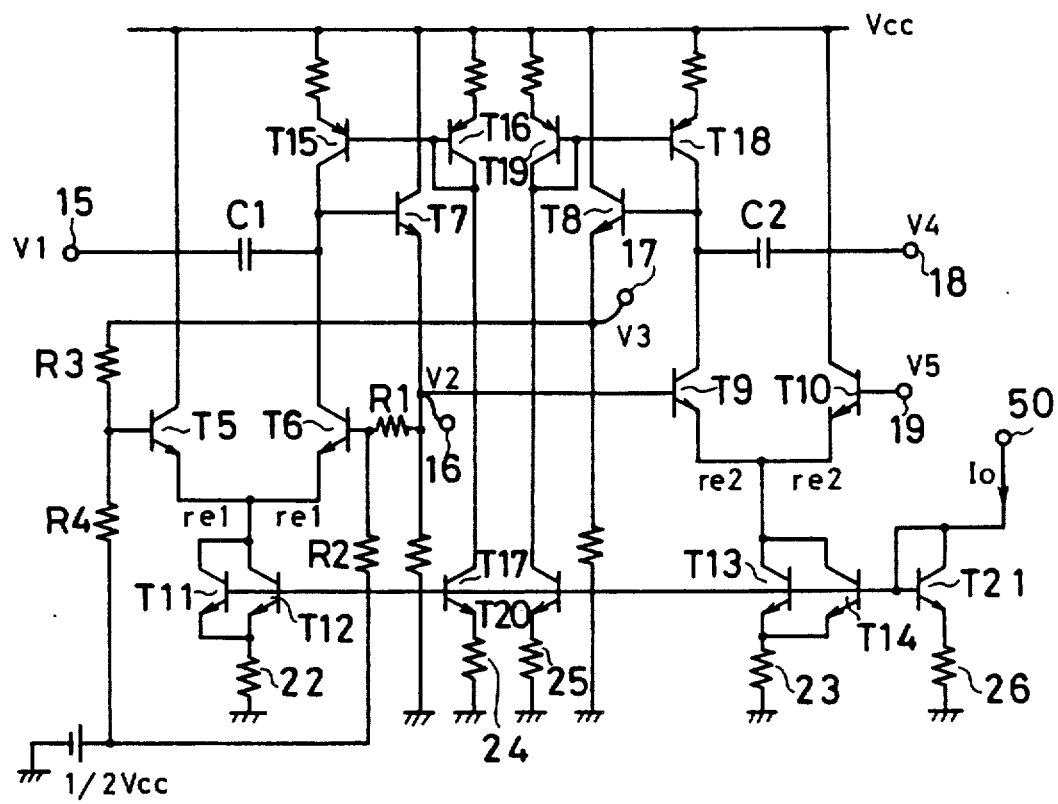
FIG. 7 is a circuit diagram specifically showing FIG. 6 circuit.

FIG. 7 is a circuit diagram showing a specific variable filter in which the current amounts I1 and I2 can be controlled by applying the principle of the variable filter 20 as shown in FIG. 6, wherein the constant current source circuits are constituted by current mirror circuits composed of transistors and resistors so that the current amounts of the constant current source circuits can be controlled in response to a current value of the control signal Io.

Then, the circuit as shown in FIG. 7 will be described briefly. In addition, by applying the same reference symbols to the same portions as that in FIG. 6, a duplicate description will be omitted.

The constant current source circuit 11 is constituted by transistors T11 and T12 connected in parallel with each other and a resistor 22 having a resistance value of r, and a control current signal Io which is supplied to a terminal 50 is injected to a collector of a transistor T21 which constitutes a current mirror circuit along with the transistors T11 and T12. In addition, the constant current source circuit 13 is also constituted by transistors T13 and T14 connected in parallel with each other and a resistor 23 having a resistance value of r, and a current having the same current amount as the control current signal which is injected to the collector of the transistor T21 flows into the transistors T13 and T14 which constitute a current mirror circuit along with the transistor T21.

The constant current source circuit 12 is replaced with a current mirror circuit constituted by transistors T15 and T16 and a constant current source circuit constituted by a transistor T17 coupled to the transistor T16 and a resistor 24 having a resistance value of 2r, and a current amount thereof is controlled by the control current signal which is injected into a collector of the transistor T21. Similarly, the constant current source circuit 14 is replaced with a current mirror circuit constituted by transistors T18 and T19 and a constant current source circuit constituted by a transistor T20 and a resistor 25 having a resistance value of 2r, and a current amount thereof is controlled by the control current signal which is injected to a collector of the transistor T21.

On the assumption that a current amount flowing through the resistor 24 is i when the control current signal has an arbitral current value Io, the current amounts flowing through the constant current source circuits 11, 12, 13 and 14, that is, the current amounts flowing through the resistors 22, 24, 23 and 25 are as follows: a current of 2i flows through the resistors 22 and 23, a current of i flows through the resistor 25, and a collector current of each of the transistors T15 and T18 also becomes i by an operation of the current mirror circuit. Therefore, I1=I2=i and, when a resistance value of a resistor R26 is 2r, Io=i=I1=I2. In addition, resistors R1, R2, R3 and R4 are inserted to set a gain. Furthermore, the resistors R2 and R4 are connected to the ground in alternating current, and it is necessary to apply thereto a direct current bias such as Vcc/2 when such a circuit is to be operated actually.

In FIG. 7 circuit, assuming K=R2/(R1+R2) and L=R4/(R3+R4), if operations similar to the above described equation (9) and (10) are performed, the following equations (9') and (10') are established and, when V3 is eliminated, the following equation (18') is obtainable.

$$\frac{LV3 - KV2}{2re1} \cdot \frac{1}{j\omega C1} = V2 - V1 \qquad (9')$$

-continued $$\frac{V5 - V2}{2re2} \cdot \frac{1}{j\omega C2} = V3 - V4 \qquad (10')$$

$$S^2 \cdot 4re1re2 \cdot C1C2 \cdot V1 + S \cdot 2re2C2 \cdot L \cdot V4 + L \cdot V5 = (S^2 \cdot 4re1re2 \cdot C1C2 + S \cdot 2re2C2 \cdot K + L)V2 \qquad (18')$$

By applying the condition 1 to the equation (18'), the following equations is obtained.

$$Vout/Vin = S \cdot \frac{\omega 0'}{Q'} \left/ \left( S^2 + \frac{\omega 0'}{Q'} \cdot S + \omega 0'^2 \right) \right.$$

wherein,
$\omega 0' = (L/4re1re2 \cdot C1C2)^{\frac{1}{2}}$ $$Q' = \frac{1}{K}(LI2C1/I1C2)^{\frac{1}{2}} = \frac{1}{K}(LC1/C2)^{\frac{1}{2}}$$

The above equation indicates a transfer function of the BPF.

In addition, when the condition 2 is applied to the above described equation (18'), the following equation is obtained.

$$Vout/Vin = \left( S^2 - \frac{\omega 0'}{Q'} \cdot S + \omega 0'^2 \right) \left/ \left( S^2 + \frac{\omega 0'}{Q'} \cdot S + \omega 0'^2 \right) \right.$$

The above equation indicates a transfer function of the APF.

Next, a description will be made on a voltage control oscillator (VCO) which is constituted by the variable filter 20 having the above described circuit configuration.

In order to apply the condition 1 to the variable filter 20, the terminals 15 and 19 are connected to the round in alternating current, the terminal 18 is used as the input terminal which is supplied with the output of the amplifier 5, the terminal 16 is used as the output terminal which is coupled to the input of the amplifier 5, and an added current Io+Δi which is obtained by adding the current Io from the LPF 8 which is supplied to the terminal 50 as the control signal and a current Δi from the VCA 2 (described later in detail), and then, the variable filter 20 operates as the variable BPF 4. BY inserting the amplifier 5 between an input and an output of the BPF, the VCO 3 is constituted, and a frequency modulated signal F=Fo+Δf can be outputted.

In addition, the above described variable filter 20 receives as the control signal therefor not the voltage but the current, and therefore, it is preferably that such a circuit is represented as a current controlled oscillator in practical; however, in this text, the circuit is represented as a voltage controlled oscillator (VCO) according to common usage because signals are generally sent and received between electronics equipments in a form of a voltage.

In addition, by applying the condition 2 to the variable filter 20, the terminals 15 and 16 are used as an input terminal which is supplied with a clock signal CK, the terminal 18 is supplied with a signal having a reverse polarity to the clock signal CK, the terminal 16 is used as the output terminal which is coupled to an input end of the phase comparator 7, and the terminal 50 is supplied with the current Io as the control signal, the variable filter 20 operates as the variable APF 6.

In accordance with the above described equation (24), in a case where the filter shown in FIG. 6 functions as the variable BPF, the oscillation angle frequency ωo is represented as follows:

$$\omega o = \frac{q}{2KT}(I1 I2/C1 C2)^{\frac{1}{2}}$$

when a circuit is designed to obtain conditions that C1=C2=C and that I1=I2=I, the oscillation frequency F of the variable BPF is given by the following equation (25).

$$F = 2\pi\omega o = 2\pi \cdot (q/2KT) \cdot (I/C) \qquad (25)$$
$$= (\pi q/KT) \cdot (I/C)$$

Therefore, the oscillation frequency F is determined by the control current I, a capacitance value C of the capacitor and the absolute temperature T.

Dividing the equation (25) into the center frequency Fo and the frequency deviation amount Δf the following equation (26) is obtainable.

$$F = Fo + \Delta f = 2\pi \cdot (q/2KT) \cdot (Io + \Delta i)/C \qquad (26)$$
$$= (\pi q/KT) \cdot (Io/C) + (\pi q/KT) \cdot (\Delta i/C)$$

The control current Io is supplied from the Fo control circuit 1 which is an automatic correction circuit using the variable APF 6. Since the variable APF 6 and the variable BPF 4 are formed in the same monolithic IC with the same circuit configuration as described above, a resonant point of the variable BPF 4 is in proportion to the clock signal CK as similar to that of the variable APF 6, and therefore, in a state where a frequency of the clock signal CK from the external is maintained at a constant value, the center frequency Fo also becomes constant value. In addition, in accordance with the above described equation (26), since the equation Fo=(πq/KT)·(Io/C) is established, the following equation (38) is obtainable.

$$Io = FoKTC/\pi q \qquad (38)$$

Figure 2:
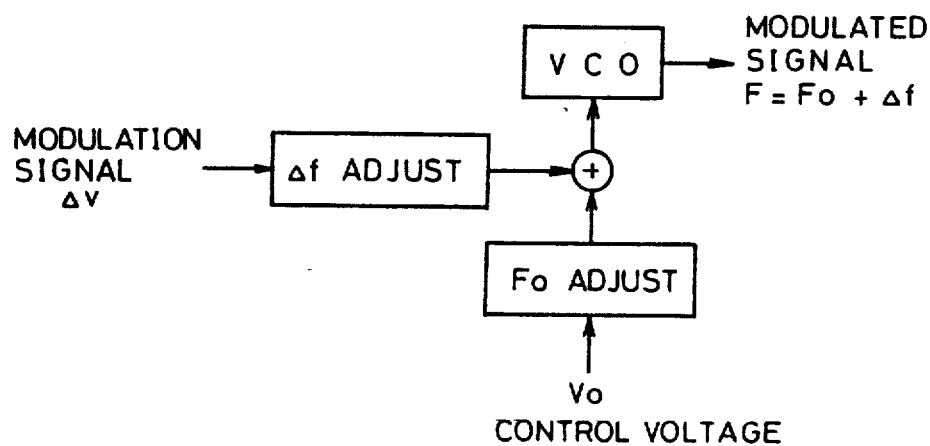
FIG. 2 is a block diagram showing one example of a conventional frequency modulator.
Figure 5:
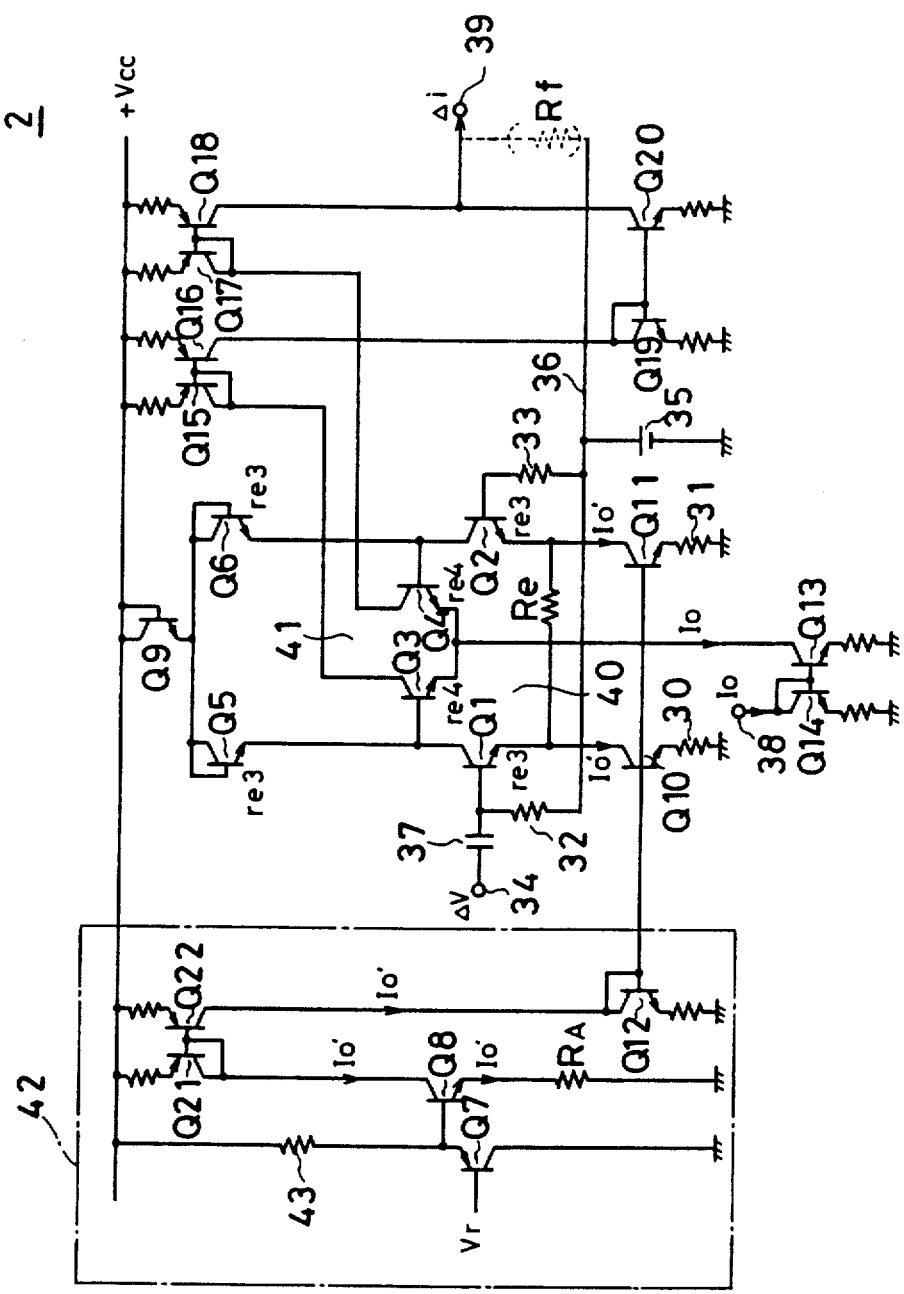
FIG. 5 is a circuit diagram showing a VCA and associated portions as shown in FIG. 4.

Next, a specific circuit configuration of the VCA 2 is shown in FIG. 5. In addition, since all the elements of the block diagram of FIG. 2 are formed in the same monolithic IC, the VCA 2 is also formed in the same monolithic IC as similar to the variable BPF 4 and the variable APF 6.

The VCA 2 is mainly composed of a differential pair 40 which is constituted by a pair of NPN transistors Q1 and Q2 and arranged at outside, and a differential pair 41 which is coupled to the differential pair 40 in series and constituted by a pair of transistors Q3 and Q4 and arranged at inside. Collectors of the transistors Q1 and Q2 are respectively coupled to bases of the transistors Q3 and Q4 and to emitters of NPN transistors Q5 and Q6 which are connected to each other in a diode fashion. In addition, a transistor Q9 is inserted between the collectors of the transistors Q5 and Q6 and a line for the voltage +Vcc.

On the other hand, emitters of the transistors Q1 and Q2 are coupled to both ends of a resistor Re and to collectors of transistors Q10 and Q11.

The transistors Q10 and Q11 are transistors which constitute a constant current source circuit along with respective resistors 30 and 31, and respective bases thereof are coupled to a base of a transistor Q12 constituting a bias circuit 42 (described later) to constitute a current mirror circuit.

Bases of the transistors Q1 and Q2 are coupled through resistors 32 and 33 to a line 36 which is biased at a predetermined voltage by a direct current voltage source 35, and especially, the base of the transistor Q1 is further connected to an input terminal 34 for inputting the modulation signal Δv through a capacitor 37 for cutting-off a direct current component.

Emitters of the transistors Q3 and Q4 are coupled to a collector of a transistor Q13 which constitutes a current mirror circuit along with a transistor Q14. In addition, a collector of the transistor Q14 is coupled to an input terminal 38 which is supplied with an output current Io of the Fo control circuit 1. On the other hand, collectors of the transistors Q3 and Q4 are coupled to collectors and bases of transistors Q15 and Q17 constitute current mirror circuits along with transistors Q16 and Q18, respectively, and a collector of the transistor Q16 is coupled to a collector and a base of a transistor Q19 which constitutes a current mirror circuit along with a transistor Q20, and a collector of the transistor Q18 is coupled to a collector of the transistor Q20 and an output terminal 39.

The bias circuit 42 includes a PNP transistor Q7 having a base supplied with a fixed reference voltage Vr, an emitter connected to a voltage source line through a resistor 43, and a collector connected to the ground. The emitter of the transistor Q7 is coupled to a base of an NPN transistor Q8 having a collector coupled to a collector and a base of a transistor Q21. Bases of the transistor Q21 and a transistor Q22 are coupled to each other to constitute a current mirror circuit. A collector of the transistor Q22 is coupled to a collector and a base of a transistor Q12. In addition, a resistor $R_A$ is inserted between an emitter of the transistor Q8 and the ground, and a base of the transistor Q12 is coupled to the bases of the transistors Q10 and Q11 as described above to constitute a current mirror circuit.

Next, a description will be made on an operation of the VCA 2 having the above described circuit configuration. First, in the bias circuit 42, since the transistor Q7 is a PNP type and the transistor Q8 is an NPN type, and both the transistors are formed in the same monolithic IC, if a base-emitter voltage of the transistor Q7 is $V_{BE}$, a base-emitter voltage of the transistor Q8 becomes $-V_{BE}$ which has the same absolute value and a reverse polarity as that of $V_{BE}$. Therefore, since both the base-emitter voltages are canceled with each other, and the emitter voltage of the transistor Q8 becomes the reference voltage Vr and a current Io' flowing through the resistor $R_A$ is represented by the following equation (35).

$$Io' = Vr/R_A \qquad (35)$$

The current Io' is equal to a collector current of the transistor Q8, according to a current mirror effect of the transistors Q21 and Q22, a collector current of the transistor Q12 is also equal to the current Io', and further, according to a current mirror effect of the transistors Q10, Q11 and Q12, a collector current of each of the transistors Q10 and Q11 also becomes Io'.

On the other hand, when the output current Io from the Fo control circuit 1 is supplied to the input terminal 38, according to a current mirror effect of the transistors Q14 and Q13, a collector current of the transistor Q13 also become Io. Next, a description will be made on a gain of each differential pair when the differential pairs 40 and 41 operate in this state.

A gain of a differential pair is generally given by dividing a collector resistor (load) of transistors constituting the differential pair by an emitter resistor (load), that is, the collector resistor/the emitter resistor. Then, noting the differential pair 40, an input voltage is the modulation signal Δv and an output voltage is collector voltages of the transistors Q1 and Q2 (respective collector voltages have reverse polarities to each other). Assuming that a differential resistor of the differential pair 40 is re3, an emitter load becomes 2re3+$R_E$. In addition, since each of the emitter currents of the transistors Q5 and Q6 is equal to Io′, a differential resistor of the transistors Q5 and Q6 is equal to re3, and since the differential resistor of the transistors Q5 and Q6 serves as the collector load of the differential pair 40, a voltage gain A1 of the differential pair 40 with respect to the input voltage and output voltage is given by the following equations (27).

$$A1 = re3/(2re3 + RE) \quad (27)$$

where, $$re3 = (1/Io')\cdot(KT/q) \quad (33)$$

Then, the deferential resistor re3 is extremely smaller than the resistor $R_E$, that is, a relationship of re3<$R_E$ is obtained, and therefore, the above described equation (27) is modified as follows:

$$A1 = re3/R_E \quad (28)$$

Next, noting the differential pair 41, an input voltage is equal to each of the collector voltages of the transistors Q1 and Q2 which is the output voltage of the differential pair 40, and an output voltage is a voltage generated between the output terminal 39 and the line 36, and thus, if a load resistor Rf is inserted between the output terminal 39 and the line 36 as shown by a dotted line in FIG. 5, the output voltage becomes equal to a voltage generated between both ends of the load resistor Rf. Assuming that a differential resistor of the differential pair 41 is re4, an emitter load becomes 2re4.

On the other hand, the transistors Q3 and Q4 function as a push-pull circuit, and therefore, a collector current of the transistor Q3 becomes a collector current of the transistor Q19 according to a current mirror effect of the transistors Q15 and Q16, and further, according to a current mirror effect of the transistors Q19 and Q20, the collector current of the transistor Q3 becomes a collector current of the transistor Q20. In addition, a collector current of the transistor Q4 becomes a collector current of the transistor Q18 according to a current mirror effect of the transistors Q17 and Q18. When the collector current of the transistor Q4 increases, the collector current of the transistor Q3 decreases, and the collector current of the transistor Q18 becomes larger than the collector current of the transistor Q20, and thus a current amount due to an increase of the collector current of the transistor Q20 is outputted as an output current Δi. In reverse, when the collector current of the transistor Q3 increases, the collector current of the transistor Q4 decreases, the collector current of the transistor Q18 becomes smaller than the collector current of the transistor Q20, and thus, a current amount for compensating a lack due to a decrease of the collector current of the transistor Q20 flows into the terminal 39 inversely. Therefore, the load resistor Rf contributes to the collector load of the transistors Q3 and Q4, and therefore, the collector load of the differential pair 41 becomes 2Rf.

Then, a voltage gain A2 of the differential pair 41 is given by the following equation (29).

$$A2 = 2Rf/2re4 = Rf/re4 \quad (29)$$

where, $$re4 = (1/Io)\cdot(KT/q) \quad (30)$$

Since the output voltage is Rf·Δi, in accordance with the equation (29), a gain A3 of voltage-current (V-I) conversion in the differential pair 41 is given by the following equation (31).

$$A3 = A2/Rf = (Rf/re4)/Rf = 1/re4 \quad (31)$$

Then, the VCA 2 of this embodiment shown is actually a V-I converter of a current controlled gain type, and therefore, a gain A of the V-I converter is a product of a voltage gain A1 by the V-I gain A3 and therefore, represented by the following equation (32).

$$A = \Delta i/\Delta v = A1 \cdot A3 = (re3/RE)\cdot(1/re4) \quad (32)$$

Furthermore, if the equations (33) and (30) are substituted for the equation (32), the following equation (34) is obtainable.

$$A = (1/Io') \cdot (KT/q)/\{R_E \cdot (1/Io) \cdot (KT/q)\} \quad (34)$$
$$= Io/(Io' \cdot R_E)$$

In addition, if the equation (35) is substituted for the equation (34), the following equation (36) is obtainable.

$$\Delta i/\Delta v = Io/\{(Vr/R_A)\cdot R_E\}\Delta i = \Delta v \cdot Io/\{Vr\cdot(R_E/R_A)\} \quad (36)$$

Since a relative accuracy of resistors is very good in a monolithic IC, $R_E/R_A$ becomes a constant value, and thus, since the reference voltage Vr is also a constant voltage, it is possible to consider that the equation 1/{Vr·($R_E/R_A$)} = m (m is a constant value). Therefore the above described equation (36) is represented by the following equation (37).

$$\Delta i = m\cdot Io\cdot\Delta v \quad (37)$$

In accordance with the equation (26), the following equation (39) is obtainable, and therefore, if the equations (38) and (37) are substituted for the equation (39), the following equation (40) is obtainable.

$$\Delta f = (\pi q/KT)(\Delta i/C) \quad (39)$$

$$\Delta f = (\pi q/KT)\cdot(m\cdot Io\cdot\Delta v/C) = m\cdot Fo\cdot\Delta v \quad (40)$$

The equation (40) is the same as the equation (8), and therefore, by constructing the VCA 2 as shown in FIG. 5 and setting m to be coincident with a target value, a frequency modulated signal having a frequency deviation amount Δf which is not dependent upon variations of capacitors of VCO and a temperature drift thereof can be outputted.

In other words, in a case where a temperature dependency exists in an oscillation frequency as represented by the above described equation (25) as represented by the equation (26), the center frequency Fo as well as a frequency deviation amount Δf are dependent on a temperature; however, in accordance with this embodiment shown, it becomes unnecessary to apply an adjustment taking into consideration of such a temperature dependency to the input of the VCO.

In addition, a combination of the VCO 3 and VCA 2 of FIG. 4 can be regarded as a sort of a VCO, and therefore, if such a VCO is used as a PLL (Phase Locked Loop) circuit, an FM demodulator in which a demodulation sensitivity is determined by the above described equation (8) is obtained. Especially, in a sound signal recording circuit of an 8 mm VTR or the like, an FM modulator becomes necessary in recording and an FM demodulator becomes necessary in playing, and therefore, by applying the above described embodiment to such an FM demodulator, it is possible to obtain an FM modulation and demodulation system of adjustment free.

Figure 9:
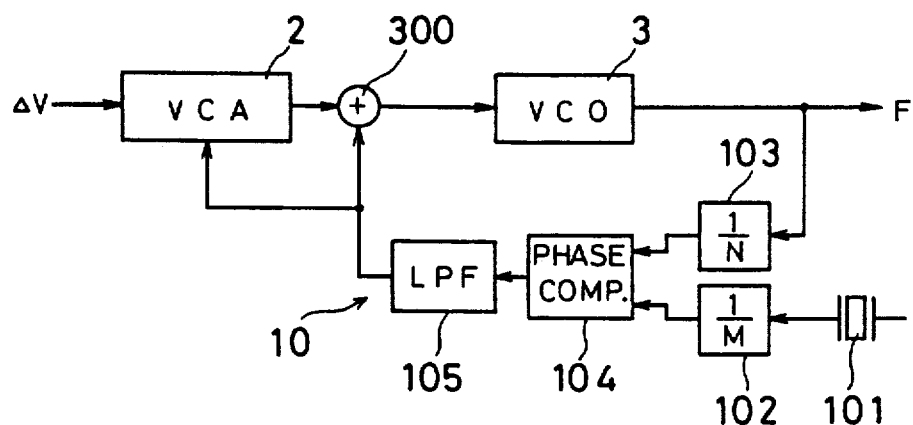
FIG. 9 is a block diagram showing another embodiment in accordance with the present invention.

FIG. 9 is a block diagram showing another embodiment in accordance with the present invention. In the above described embodiment, the center frequency control circuit 1 is constituted by the variable APF 6, the phase comparator 7 and the LPF 8. By contrast, in FIG. 9 embodiment, a center frequency control circuit 10 is constituted as a PLL which includes a crystal oscillator 101. More specifically, an output of a crystal oscillator 101 is frequency-divided by 1/M by a programmable frequency divider 102 and then inputted to a phase comparator 106. The phase comparator 104 also receives an output of the VCO 3 which is frequency-divided by 1/N (N≠M or N=M) by a programmable frequency divisor 103. Therefore, a voltage in response to a phase difference of both the inputs is outputted from the phase comparator 104, and the voltage is given to the adder 300 and the VCA 2 as a control signal of a direct current voltage, respectively, as similar to the above described embodiment. In FIG. 9 embodiment, as similar to the above described embodiment, the direct current voltage form the PLL, that is, the center frequency control circuit 10 controls a center frequency of the VCO 3 and an amplitude of an alternating current signal from the VCA 2, that is, a frequency deviation amount.

In addition, in FIG. 4 embodiment and FIG. 9 embodiment, a frequency modulator of adjustment free is described. However, as shown in FIG. 10 embodiment, a rough adjustment may be performed by a variable resistor and a fine adjustment may be performed by a PLL.

Figure 10:
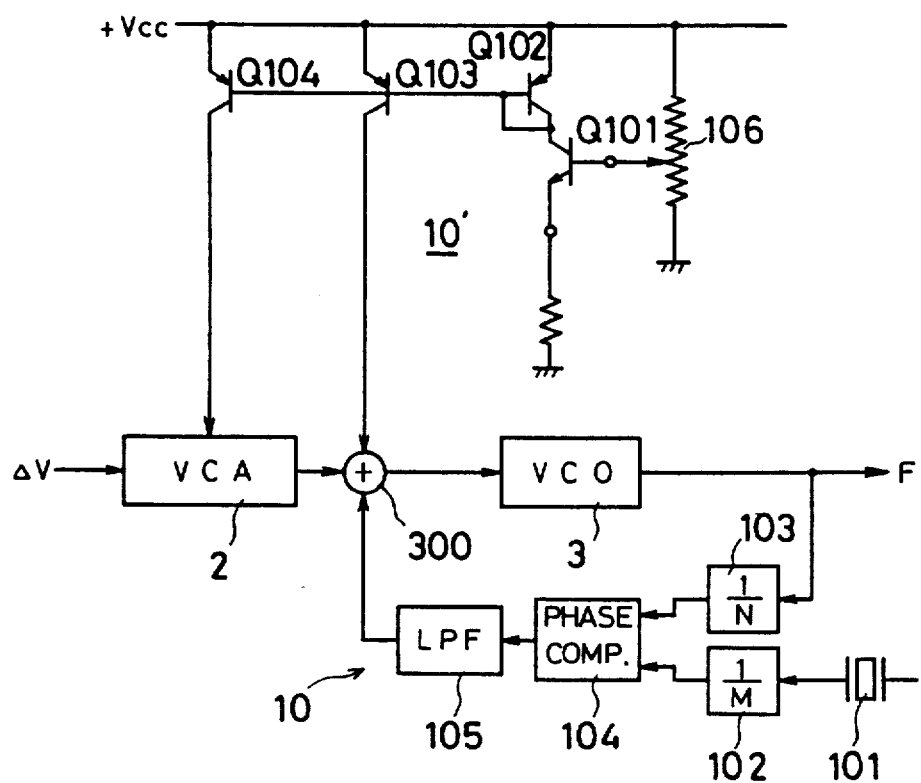
FIG. 10 is a block diagram showing the other embodiment in accordance with the present invention.

With reference to FIG. 10, in this embodiment shown, a center frequency control circuit 10' includes a variable resistor 106 and a voltage from the variable resistor 106 is applied to a base of a transistor Q101. The transistor Q101 constitutes a conversion circuit as similar to the transistor Q91 of FIG. 4A, which converts the output voltage of the variable resistor 106 into a current. Then, transistors Q102, Q103 and Q104 constitute a current mirror circuit. Therefore, respective output currents of the transistor Q103 and Q104 are in proportion to the output voltage of the variable resistor 106. The output currents of the transistors Q103 and Q104 are applied to the VCA 2 and the adder 300 respectively as similar to FIG. 4 embodiment. Therefore, in this embodiment shown, the center frequency and the frequency deviation amount of the VCO 3 can be controlled by only the center frequency control circuit 10', that is, variable resistor 106.

In addition, in FIG. 10 embodiment, for a fine adjustment, the center frequency control circuit 10 shown in FIG. 9 can be used. However, since it is possible to control the gain of the VCA 2 by only the variable resistor 106, the output of such a Fo control circuit 10 is given to only the VCO 3 and is not given to the VCA 2.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A frequency modulator, comprising:
an oscillator an oscillation frequency of which is variable in response to a control signal inputted to a first control input thereof;
first means for generating a direct current signal which determines a center frequency of said oscillator;
second means for generating an alternating current signal which has an amplitude in proportion to a modulation signal and determines a frequency deviation amount of said oscillator, said second means having a second control input;
first voltage applying means for applying said direct current signal and said alternating current signal to said first input of said oscillator; and
second voltage applying means for applying said direct current signal to said second control input of said second means so that said amplitude of said alternating current signal can be controlled by said direct current signal.

2. A frequency modulator in accordance with claim 1, wherein said center frequency control means includes a variable resistor an output voltage of which is applied to said first input of said oscillator and said second control input of said second means.

3. A frequency modulator in accordance with claim 2, wherein said center frequency control means further includes a phase-locked loop constituted by including said oscillator, an output signal of said phase-locked loop being applied to only said first control input of said oscillator.

4. A frequency modulator in accordance with claim 1, wherein said center frequency control means includes a phase-locked loop constituted by including said oscillator, an output signal of said phase-locked loop is applied to said first control input of said oscillator and said second control input of said second means.

5. A frequency modulator in accordance with claim 1, wherein said center frequency control means includes a variable all-pass filter which receives a clock signal, a phase comparator which compares a phase of an output of said variable all-pass filter with a phase of said clock signal, and a low-pass filter which receives an output of said phase comparator, an output signal of said low-pass filter is applied to said first control input of said oscillator and said second control input of said second means.

6. A frequency modulator in accordance with claim 1, wherein said oscillator includes an amplifier and a variable band-pass filter for feeding-back an output of said amplifier to an input thereof, and an output of said variable band-pass filter is outputted as a frequency-modulated signal.

* * * * *